(12) United States Patent
Liang et al.

(10) Patent No.: US 8,647,892 B2
(45) Date of Patent: Feb. 11, 2014

(54) INLINE PROCESS CONTROL STRUCTURES

(75) Inventors: Kai-Chih Liang, Zhubei (TW); Wen-Chuan Tai, Dayuan Township, Taoyuan County (TW); Chun-Ren Cheng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 42 days.

(21) Appl. No.: 12/907,620

(22) Filed: Oct. 19, 2010

(65) Prior Publication Data

US 2012/0091454 A1    Apr. 19, 2012

(51) Int. Cl.
*H01L 23/58*    (2006.01)
*H01L 21/66*    (2006.01)

(52) U.S. Cl.
USPC ..... 438/8; 438/7; 438/9; 438/16; 257/E21.53; 257/E23.002

(58) Field of Classification Search
USPC ................................. 438/7, 8, 9, 16
See application file for complete search history.

(56) References Cited

U.S. PATENT DOCUMENTS 6,750,152 B1 *  6/2004  Christenson et al. ......... 438/735

\* cited by examiner

*Primary Examiner* — Alexander Ghyka
(74) *Attorney, Agent, or Firm* — Haynes and Boone, LLP

(57) ABSTRACT

A method for process control is disclosed. The method includes performing an etching process on a semiconductor substrate forming a structure and a test structure having a pattern and a releasing mechanism coupled to the pattern; and monitoring the pattern of the test structure to determine whether the etching process is complete.

12 Claims, 5 Drawing Sheets

INLINE PROCESS CONTROL STRUCTURES

BACKGROUND

High aspect ratio structures are often used in micro-electro-mechanical systems (MEMS) sensors and actuator designs. High aspect ratio structures improve sensor sensitivity, signal output, signal to noise ratio, and so on. Thus, it is important to confirm the etching quality of high aspect ratio structures.

Current inline process controls are either destructive in nature and/or are ineffective in confirming the etching quality of a high aspect ratio structure. For example, a scanning electron microscope (SEM) can be used to confirm the etching quality of a high aspect ratio structure. However, using a SEM involves a destructive analysis because the wafer has to be cut in order to provide a cross-sectional view capable of being scanned. Besides the destructive nature, the disadvantages of using SEM-type analysis also include higher costs and longer cycle times.

Additionally, an alpha stepper can be used as a process control method to confirm the etching quality of high aspect ratio structures. However, the resolution of this technique is low. Thus, the alpha stepper is unable to scan to the bottom of structures having deep aspect ratios.

Furthermore, a white light interferometer can be used as a process control method to confirm the etching quality of high aspect ratio structures. However, even this non-destructive method is ineffective. For example, problems such as interference and transparency make the use of a white light interferometer undesirable to confirm the etching quality of a high aspect ratio structure.

Accordingly, what is needed is a non-destructive control method to monitor a manufacturing process and determine automatically when structures on a wafer have reached a desired dimension, such as a specified aspect ratio.

SUMMARY

The present disclosure provides a method for process control. The method includes performing an etching process on a semiconductor substrate forming a structure and a test structure having a pattern and a plurality of releasing mechanisms; and monitoring the pattern of the test structure to determine whether the etching process is complete.

In certain embodiments, the monitoring step is performed in parallel with the etching process. In other embodiments, the monitoring step is performed after the etching process. In another embodiment, the process includes performing a second etching process if the monitoring step determines that the etching process is not complete. In another embodiment, forming the test structure includes forming a plurality of test structures having a plurality of patterns, and monitoring the pattern of the test structure includes monitoring the plurality of test structures and the plurality of patterns to determine whether the dimension of the structure is within a specified range. In another embodiment, the etching process is complete when a dimension of the structure has been achieved. In another embodiment, the dimension is selected from a group consisting of an aspect ratio, an etch depth, and a critical dimension. In other embodiments, forming the test structure includes forming a plurality of test structures having a plurality of patterns; and monitoring the pattern of the test structure includes monitoring the plurality of test structures and the plurality of patterns to determine whether the dimension of the structure is within a specified range.

The present disclosure also provides a semiconductor structure. The structure includes a pattern formed on a substrate. The substrate includes a test structure formed on the substrate having an optical indicator that indicates a dimension of a structure formed on the substrate has been achieved, and a plurality of release mechanisms coupled to the optical indicator.

In certain embodiments, the test structure includes a first layer and a second layer, the first layer has a top surface that is substantially coplanar with a first plane before an etching is performed, and the second layer has a top surface that is substantially coplanar with a second plane before the etching is performed; and the top surface of the first layer is substantially out-of-plane with the first plane after the etching is performed, and the top surface of the second layer is substantially out-of-plane with the second plane after the etching is performed. In another embodiment, the top surface of the first and second layers are substantially in-plane with the first and second planes, respectively, after the etching is performed, and the surface of the pattern is deformed. In another embodiment, the second layer is a stress film affecting a behavior of the optical indicator of the test structure. In another embodiment, the first and second layer are composed of materials selected from a group consisting of: germanium, silicon, silicon carbide, gallium arsenic, gallium phosphide, indium phosphide, indium arsenide, indium antimonide, and all related conductive or dielectric films. In certain embodiments, the test structure is asymmetric. Alternatively, the test structure is symmetric.

The present disclosure also provides a system for process control. The system includes an etching tool designed to perform an etching process to a semiconductor substrate; and an optical module integrated with the etching tool. The etching tool is used to etch onto the substrate a structure having a dimension, such as a critical dimension, and a test structure having a pattern indicating whether the dimension has been achieved. The optical module is configured to monitor the pattern of the test structure to determine whether the dimension of the structure has been achieved.

In one embodiment, the optical module includes an optical microscope. In certain embodiments, the structure is formed in a cell area of the substrate and the test structure is formed in the cell area. In other embodiments, the structure is formed in a cell area of the substrate and the test structure is formed in a scribe line of the substrate. In other embodiments, the dimension is selected from a group consisting of an aspect ratio, an etch depth, and a critical dimension. In certain embodiments, the pattern has a top surface extending a first distance from the substrate prior to an etching of the test structure and the structure, and the top surface of the pattern extends a second distance from the substrate after the etching of the test structure and the structure, the second distance being different than the first distance. In certain embodiments, the second distance is less than the first distance. Alternatively, the second distance is greater than the first distance. In other embodiments the pattern of the test structure is substantially coplanar with a plane prior to an etching and the pattern falls substantially out-of-plane with the plane after the etching to indicate that the dimension has been achieved. In another embodiment, the optical module detects the pattern being out-of-focus to determine whether the dimension has been achieved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
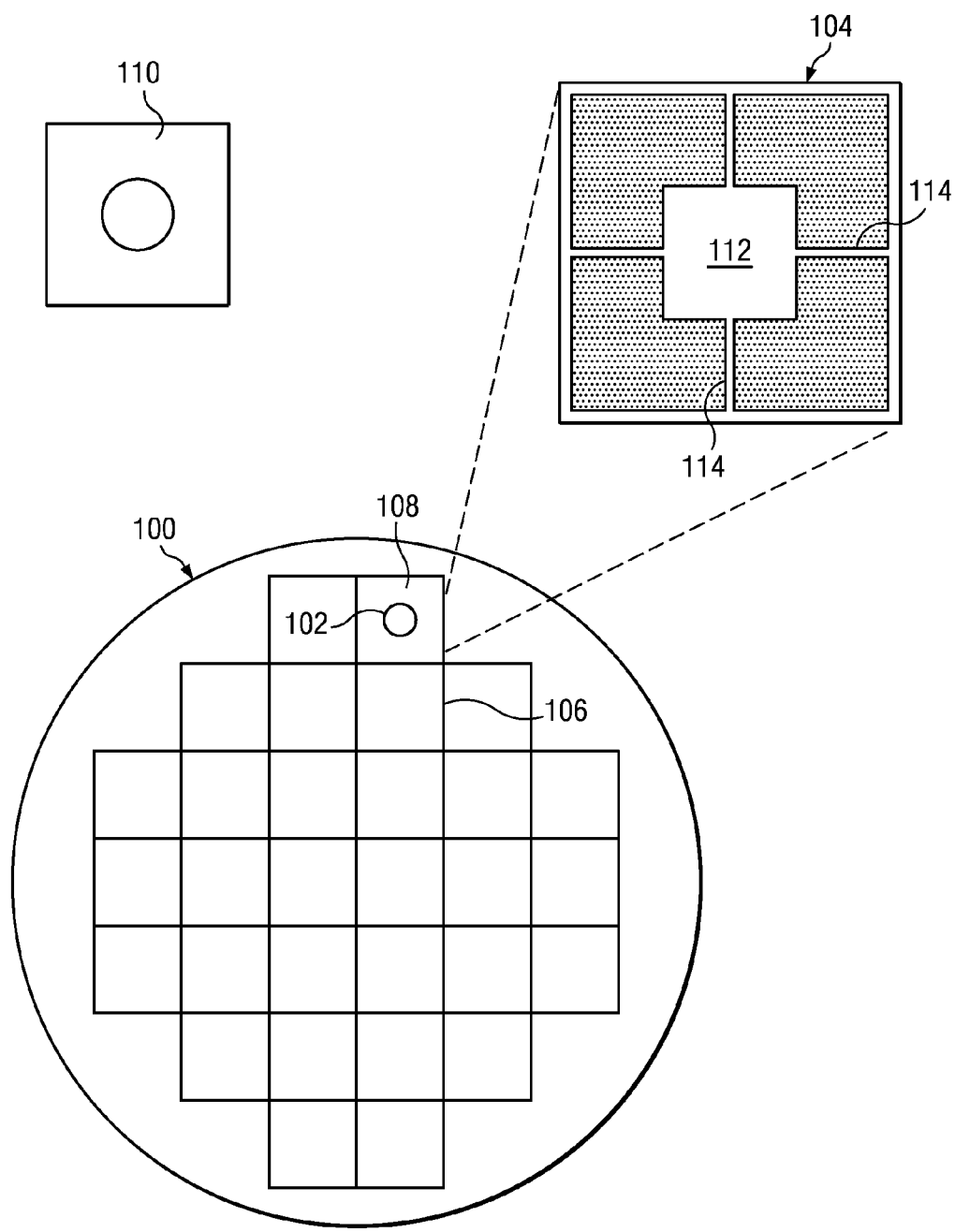
FIG. 1 is a perspective view of an embodiment of a wafer containing a test structure according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a perspective view of a semiconductor wafer 100 having a structure 102 and a test structure 104. As shown, wafer 100 has a plurality of cell areas (or dies) 108 and a plurality of scribe lines 106. Wafer 100 is composed of a semiconductor material such as germanium, silicon, silicon carbide, gallium arsenic, gallium phosphide, indium phosphide, indium arsenide, or indium antimonide. Structure 102 is formed on the wafer 100 inside cell area 108 in accordance with a specific design layout having specified and/or desired dimensions for structure 102. The one or more specified dimensions of structure 102 may include, for example, a critical dimension, an etch depth, as well as an aspect ratio comprising these two components. Moreover, it is contemplated that structure 102 is considered to be any structure capable of being formed on wafer 100.

Test structure 104 is also formed on the wafer 100. In the depicted embodiment, the test structure 104 is formed within the scribe line 106. In other embodiments, the test structure 104 is located in other regions of the semiconductor wafer such as the cell area 108. Test structure 104 has a pattern 112 and releasing mechanism 114 coupled to the pattern 112. As will be described in greater detail below, the pattern 112 provides an optical indication of whether structure 102 has been formed on wafer 100 according to the specified dimension.

As shown in FIG. 1, an optical monitor 110 is used to monitor the pattern 112. Optical monitor 110 monitors pattern 112 to determine whether a specified dimension for structure 102 has been achieved. For example, optical monitor 110 monitors pattern 112 and when the pattern is out-of-focus or out-of-plane with, for example, the surface of wafer 100, it is determined that the specified dimension for structure 102 has been achieved. In another embodiment, optical monitor 110 monitors pattern 112 for an in-plane deformation, where the pattern deforms while staying substantially in-plane with the surface of wafer 100. The optical monitor 110 may be any device for detecting and monitoring visual or other wavelengths of light such as an optical microscope. In another embodiment, the optical monitor may be a naked human eye.

Figure 2A:
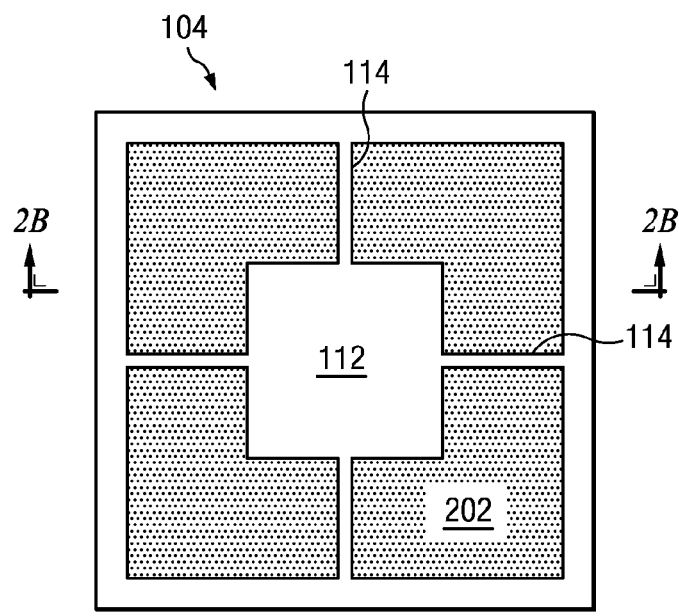
FIG. 2A is a perspective view of the test structure of FIG. 1 according to various aspects of the present disclosure.
Figure 2B:
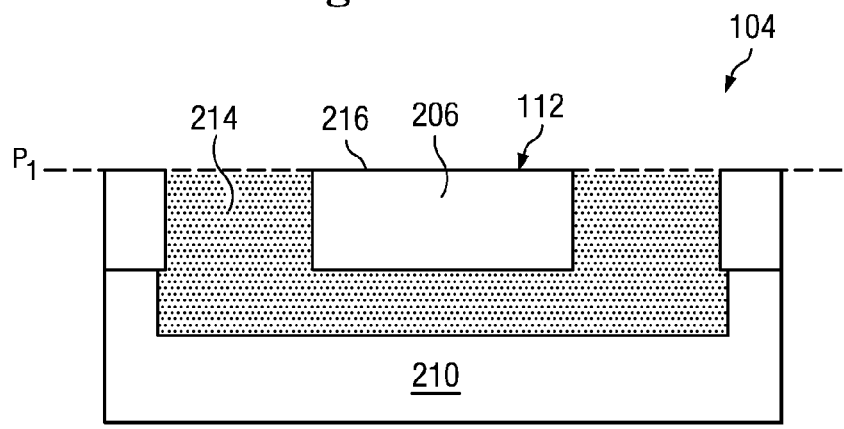
FIG. 2B is a diagrammatic cross-sectional view of the test structure of FIG. 2A taken along line 2B-2B in FIG. 2A prior to an etching process.
Figure 2C:
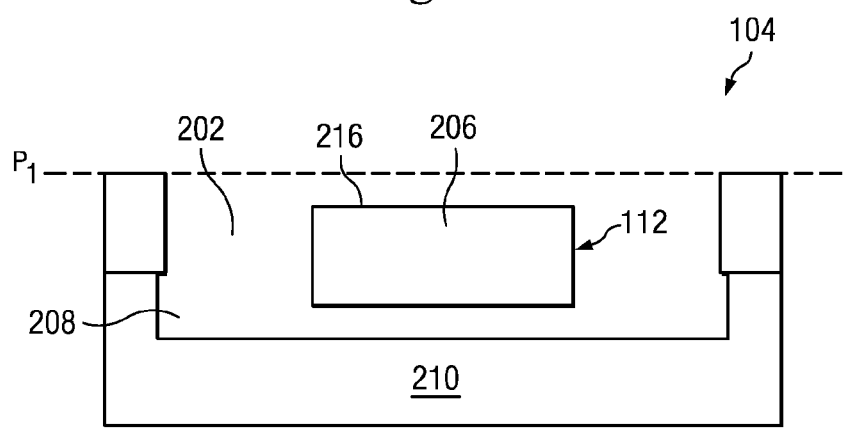
FIG. 2C is a diagrammatic cross-sectional view of the test structure of FIG. 2A taken along line 2B-2B in FIG. 2A after an etching process.
Figure 4:
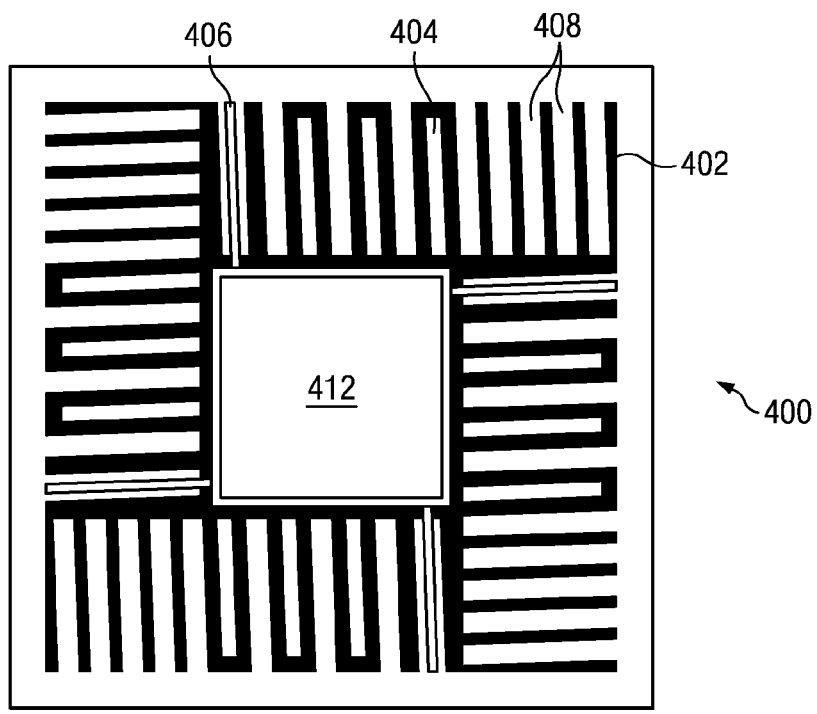
FIG. 4 is a perspective view of another embodiment of a test structure according to various aspects of the present disclosure.
Figure 5:
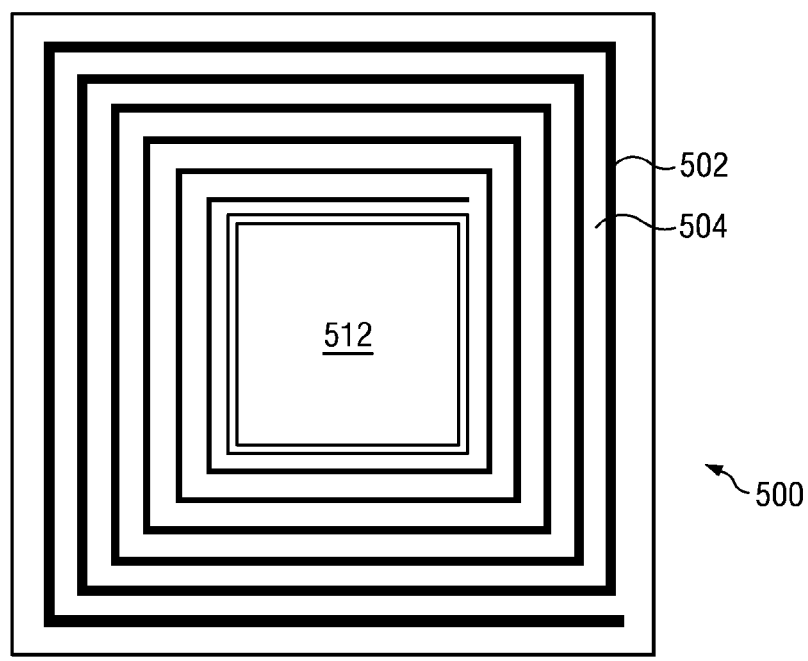
FIG. 5 is a perspective view of another embodiment of a test structure according to various aspects of the present disclosure.

FIGS. 2A-2C show perspective and cross-sectional views of test structure 104 from FIG. 1. FIGS. 2A-2C will be discussed concurrently and have been simplified for the sake of brevity and clarity. FIG. 2A is a more detailed view of test structure 104 from FIG. 1. As discussed above, test structure 104 has pattern 112 and one or more release mechanisms 114. The release mechanisms 114 are designed to be mechanically flexible and have a lower spring constant. The pattern 112 and the release mechanisms 114 are coupled equivalent to a weight and a spring, forming an oscillator with a lower frequency. The release mechanisms 114 includes various structures, such as a beam structure (as shown in FIG. 2A), a comb structure (as shown in FIG. 4), a spiral structure (as shown in FIG. 5) in various embodiments. In the depicted embodiment, there are four release mechanisms 114 surrounding the pattern 112. However, it is contemplated that any number of release mechanisms in any configuration can be used to surround pattern 112. Additionally, release mechanisms 114 are centrally disposed such that the mechanisms are centered on the respective sides of pattern 112. In alternative embodiments, release mechanisms 114 are positioned off-center from the respective sides of pattern 112.

Here, for example, release mechanisms 114 and pattern 112 are formed of the same material. For example, release mechanisms 114 and pattern 112 are formed of a silicon based material. However, in other embodiments release mechanisms 114 and pattern 112 are formed of different materials. In another embodiment, an additional film is formed on release mechanisms 114, pattern 112 or both using a different material such as germanium, silicon oxide or metal. The additional film includes different material to increase stress for effectively monitoring pattern 112 and is therefore referred to as stress film. For example, release mechanism 114 are formed of silicon based material while pattern 112 includes silicon and a stress film on the silicon. Moreover, it is contemplated that in other embodiments release mechanisms 114 and pattern 112 are formed of one or more of the following materials, such as, germanium, silicon, silicon carbide, silicon oxide or metal materials. In yet another embodiment, the stress film includes multiple material layers.

In the depicted embodiment, the test structure 104 is created by a lithography process and an etching process. The lithography process form a patterned photoresist layer by a procedure including forming a photoresist layer (resist) overlying the surface of the wafer 100, exposing the resist, performing a post-exposure bake process, and developing the resist. The etching process is applied to the substrate to form the structure 102, and the test structure 104 having pattern 112 and release mechanisms 114. For example, the etching process includes a reactive ion etch (RIE) and/or any other suitable process.

FIG. 2B shows a cross-section of test structure 104 taken along line 2B-2B of FIG. 2A. FIG. 2B is a representation of test structure 104 before etching is performed, when material 214 has yet to be removed to form trenches 202. As shown below, prior to etching the material 214 provides subjacent and lateral support for the weight of the pattern 112. A top surface 216 of the pattern 112 is substantially in plane, or coplanar, with plane $P_1$. In one embodiment, plane $P_1$ may be coplanar with the surrounding surface of the substrate 210 containing test structure 104. (Note: the material 214 and 216 are the same material)

FIG. 2C shows test structure 104 of FIG. 2B after etching has been performed to remove material 214 from etch trenches 202. Also, as shown, a cavity 208 is formed below the etch trenches 202, and the pattern 112 after etching. The release mechanisms 114 of FIG. 2A now support the weight of pattern 112 due to the removal of material 214. For example, the weight of pattern 112 causes the release mechanisms 114 to flex downward into cavity 208. This flexing causes pattern 112 to deform (e.g. out-of-focus, out-of-plane, etc.). As shown, top surface 216 is substantially out-of-plane with plane $P_1$. The deformation of pattern 112 provides an optical indication that the specified dimension has been achieved on another structure, for example, structure 102. In another embodiment of the invention, for example, pattern 112 may deform by raising or elevating in an upward direction away from the surface of the substrate 210. In another embodiment, for example, pattern 112 may deform by only certain portions of pattern 112 being raised while other portions being lowered after etching. In another embodiment, the pattern 112 may be torqued and/or twisted after etching. Different embodiments of the invention may have different mappings of patterns, release mechanisms and etch trenches depending on the specified dimension to be detected by the test structure.

Figure 3A:
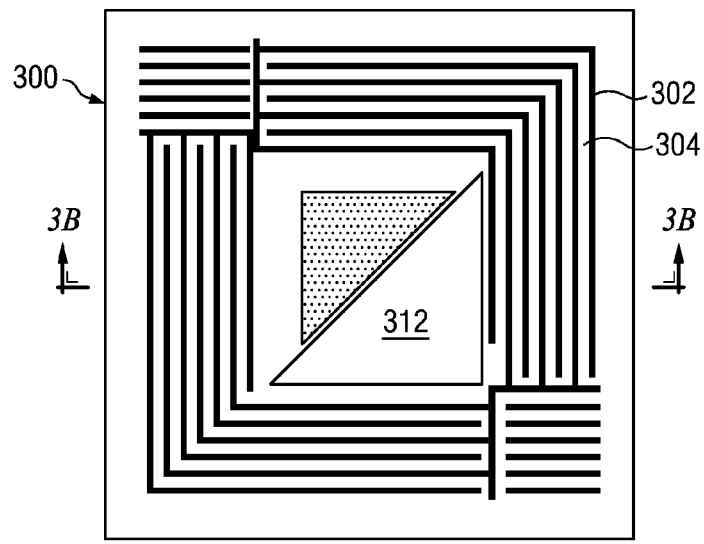
FIG. 3A is a perspective view of another embodiment of a test structure according to various aspects of the present disclosure.
Figure 3B:
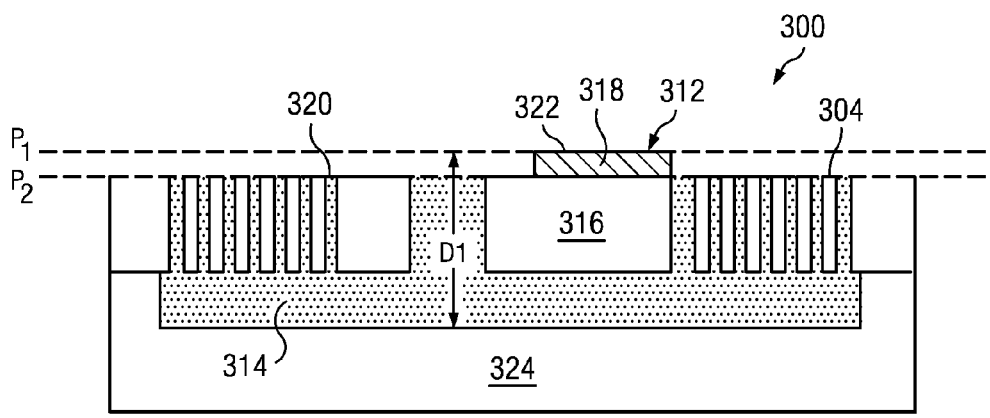
FIG. 3B is a diagrammatic cross-sectional view of the test structure of FIG. 3A taken along line 3B-3B in FIG. 3A prior to an etching process.
Figure 3C:
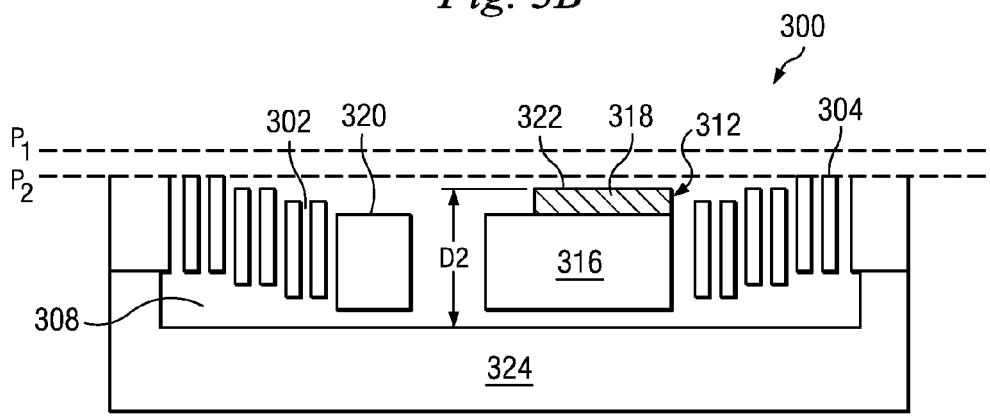
FIG. 3C is a diagrammatic cross-sectional view of the test structure of FIG. 3A taken along line 3B-3B in FIG. 3A after an etching process.

FIGS. 3A-3C show perspective and cross-sectional views of a test structure 300. FIGS. 3A-3C will be discussed concurrently and have been simplified for the sake of brevity and clarity. Referring to FIG. 3A, a test structure 300 is shown that may be formed on a substrate. In certain embodiments, the test structure 300 may be formed by any release process on surface or bulk film materials such as poly Si, A-Si, TiAl, tungsten, or silicon dioxide. As shown, test structure 300 has a pattern 312. Here, pattern 312 has a plurality of releasing mechanisms 304 surrounding that, at least in part, form a partial coil and/or spiral structure around the pattern 312. Furthermore, as discussed in more detail below and shown in FIG. 3B, pattern 312 is formed of two layers of material. In one example, the pattern 312 is asymmetric, as illustrated in FIG. 3A.

FIG. 3B shows a cross-section of test structure 300 taken along line 3B-3B of FIG. 3A. FIG. 3B is a representation of test structure 300 before etching is performed, when material 314 has yet to be removed from etch trenches 302. As shown below, before etching the material 314 provides subjacent and lateral support for the pattern 312. Furthermore, as shown here, pattern 312 is comprised of a first layer 316 and a second layer 318. Here, for example, first layer 316 and second layer 318 are formed of different materials. For example, first layer 316 is formed of silicon while second layer 318 is formed of a metal, germanium, silicon oxide or tungsten. Moreover, it is contemplated that in other embodiments first layer 316 is formed of one or more of the following materials, such as, germanium, silicon, silicon carbide, gallium arsenic, gallium phosphide, indium phosphide, indium arsenide, or indium antimonide. The second material layer 318 is formed of metal or dielectric.

Additionally, FIG. 3B represents a cross-sectional view of test structure 300 shown in-plane or in-focus. In that regard, a top surface 320 of the first layer 316 of pattern 312 is substantially in plane, or coplanar, with plane $P_2$. For example, plane $P_2$ can represent a plane that is substantially coplanar with a top surface of the substrate 324 or some other feature of the substrate. Moreover, in the depicted embodiment, the second layer 318 has a top surface 322 that is in plane with plane $P_1$. For example, plane $P_2$ can represent a plane that is substantially coplanar with some other feature on the substrate. Furthermore, as shown, distance $D_1$ denotes the distance between top surface 322 and substrate 324 before the occurrence of the etching process.

FIG. 3C shows test structure 300 of FIG. 3B after etching has been performed to remove material 314 from etch trenches 302. Also, as shown, a cavity 308 is formed below the releasing mechanisms 304, etch trenches 302, and the pattern 312 after etching. The releasing mechanisms 304 now support the weight of pattern 312 due to the removal of material 314. For example, the weight of pattern 312 causes the releasing mechanisms 304 to flex downward into cavity 308. This flexing causes pattern 312 to deform (e.g. out-of-plane, out-of-focus, etc.). As shown, top surfaces 322 and 320 are substantially out-of-plane with planes P1 and P2, respectively. The deformation of pattern 312 provides an optical indication that the specified dimension has been achieved on another structure, for example, structure 102.

Furthermore, as shown in FIG. 3C, distance $D_2$ denotes the distance between top surface 322 and the substrate 324 after the etching process. As shown, distance $D_2$ is less than distance $D_1$ (see FIG. 3B) indicating that pattern 312 is out-of-focus. In another embodiment, distance $D_2$ is greater than distance $D_2$ after the etching process and also indicates that pattern 312 is out-of-focus. In such an embodiment, pattern 312 elevates or rises such that distance $D_2$ is greater than distance $D_1$.

Figure 6:
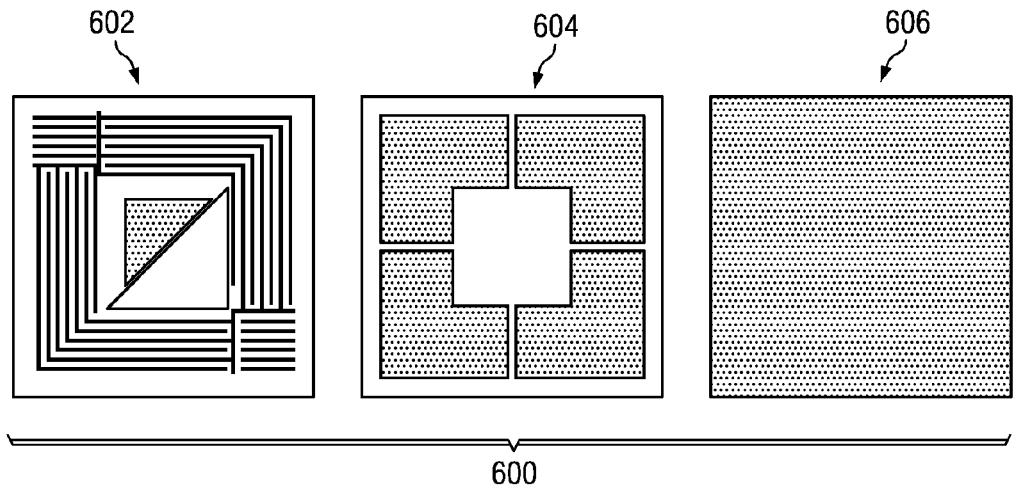
FIG. 6 is a perspective view of an array of test structures according to various aspects of the present disclosure.

FIGS. 4-6 show various test structures. The test structures are designed to have various patterns that when deformed (e.g. out-of-plane, out-of-focus, etc.) indicate that a desired dimension has been achieved on a corresponding structure being formed on a wafer. Thus, although various exemplary test structures are shown, it is contemplated that a test structure can be formed with any configuration that can be used to determine whether the desired dimension has been achieved for a corresponding structure. Test structures may include any combination, including any desired shape, of any number of patterns, release mechanisms, comb structures, or any other feature capable of being formed according to the present disclosure.

FIG. 4 shows a perspective view of another embodiment of a test structure 400 having a pattern 412. The test structure 400 also contains a comb structure comprising a plurality of comb fingers 404 and a plurality of etch trenches 402. The comb structure has a pitch 408 representing the frequency of the repeating of the comb fingers 404. As shown, at least four comb fingers 404 act as release mechanisms 406 for pattern 412. However, it is contemplated that any number of release mechanisms can be used to surround pattern 412. Additionally, release mechanisms 406 are positioned off-center from the respective sides of pattern 412. In that regard, release mechanisms 406 are positioned near and/or adjacent an edge of the pattern 412. In alternative embodiments, release mechanisms 406 are centrally disposed such that the mechanisms are centered on the respective sides of pattern 412.

Furthermore, pattern 412 is a two layer pattern because it is formed of two layers of material. For example, pattern 412 is comprised of a first layer and a second layer. Here, for example, the first layer and the second layer are formed of different materials. For example, the first layer is formed of silicon based material while second layer is formed of a metal. Moreover, it is contemplated that in other embodiments the first layer is formed of one or more of the following materials, such as, germanium, silicon, silicon carbide, gallium arsenic, gallium phosphide, indium phosphide, indium arsenide, or indium antimonide. The second layer is formed of metal, silicon oxide, germanium or other proper material. In such embodiments, the first layer and the second layer can be formed of substantially the same material or can be formed of substantially different material.

As discussed above, the pattern 412 provides an optical indication of whether another structure being formed on the wafer has been formed according to a specified dimension. After an etching process has completed, the pattern 412 will deform (e.g. out-of-plane, out-of-focus, etc.) to indicate that the specified dimension has been achieved. In some embodiments, the pattern will fall out-of-plane with the surface of the surrounding substrate or wafer. In other embodiments, the pattern will elevate or raise in relation to the surface of the surrounding substrate or wafer. In other embodiments, the pattern will deform by torquing, twisting, in-plane deformation, or otherwise becoming out-of-focus.

FIG. 5 shows a perspective view of another embodiment of a test structure 500 having a pattern 512. The test structure 500 has a plurality of releasing mechanisms 504 forming a coil and/or spiral structure around the pattern 512. Moreover, a plurality of etch trenches 502 separate the releasing mechanisms 504 after etching.

Furthermore, pattern 512 is considered a two layer pattern because it is formed of two layers of material. For example, pattern 512 is comprised of a first layer and a second layer. Here, for example, the first layer and the second layer are formed of different materials. For example, the first layer is formed of silicon material while second layer is formed of a metal, or other proper material. However, in other embodiments the first and second layers are formed of substantially similar materials.

As discussed above, pattern 512 provides an optical indication of whether another structure being formed on the wafer has been formed according to a specified dimension. After an etching process has completed, the pattern 512 will deform (e.g. out-of-plane, out-of-focus, etc.) to indicate that the specified dimension has been achieved on the other structure. In some embodiments, the pattern will fall out-of-plane with the surface of the surrounding substrate or wafer. In other embodiments, the pattern will elevate or raise in relation to the surface of the surrounding substrate or wafer. In other embodiments, the pattern will deform by torquing, twisting, in-plane deformation, or otherwise becoming out-of-focus.

FIG. 6 shows a perspective view of an array 600 of test structures comprising test structures 602, 604, and 606. These structures may be formed in the scribe line area or in a cell area of the wafer. The array 600 may be used to detect whether one or more thresholds of structure dimensions were achieved during an etching process. In the depicted embodiment, the surface of test structures 602 and 604 are in plane with the surface of the surrounding wafer or substrate, meaning their patterns are in focus or visibly discernible. As discussed above, optical monitor 110 (or a human eye) can monitor array 600 to determine whether the test structures are out-of-focus. The pattern of test structure 606 is not visibly discernible because the surface of the structure has deformed such that it is out-of-plane with the surface of the surrounding wafer or substrate. In one embodiment, array 600 may be used to detect whether several thresholds of structure dimensions were achieved during an etching process. In the depicted embodiment, the dimension indicated by test structure 606 has been achieved. The dimensions indicated by test structures 602 and 604 have not been achieved.

In another embodiment, the array 600 can be monitored to determine whether the dimension of a structure, such as structure 102, has been achieved within a range of values. In such a scenario, each individual test structure can represent an individual incremental value of the dimension of the structure. For example, the first test structure can indicate the structure achieving a first etching depth, the second test structure can indicate achieving a second etching depth, and the third test structure can indicates achieving a third etching depth. Thus, by observing the array of test structures, one can determine whether the dimension (specified etching depth) of the structure is within the range of values indicated by the array of test structures.

In one embodiment of the array system shown in FIG. 6, test structure 606 in the array 600 may be correlated to an etch depth of 50 micrometers, test structure 604 to an etch depth of 40 micrometers, and test structure 602 to an etch depth of 30 micrometers. After the etching process has been performed, the patterns of each test structure will be etched into the wafer. If the etch depth correlated to each test structure has been achieved, then the pattern of the test structure will deform (e.g. out-of-plane, out-of-focus, in-plane etc.). By arranging the test structure into an array, it is possible to determine that the measured dimension (e.g. etch depth) is within a range of values. In the present example, the pattern of test structure 606 is deformed, indicating that an etch depth of 30 micromemters has been achieved. However, the pattern of test structure 604 is not deformed, indicating that an etch depth of 40 micrometers has not been achieved. Thus, it can be determined that an etch depth of between 30 and 40 micrometers has been achieved on the wafer simply by examining the array of test structures 600. By varying the correlated etch depths of the individual structures, the etch depth can be more precisely monitored. For example, varying the etch depth of each structure in the array by 1 micrometer would give the array 600 a precision of 1 micrometer.

Figure 7:
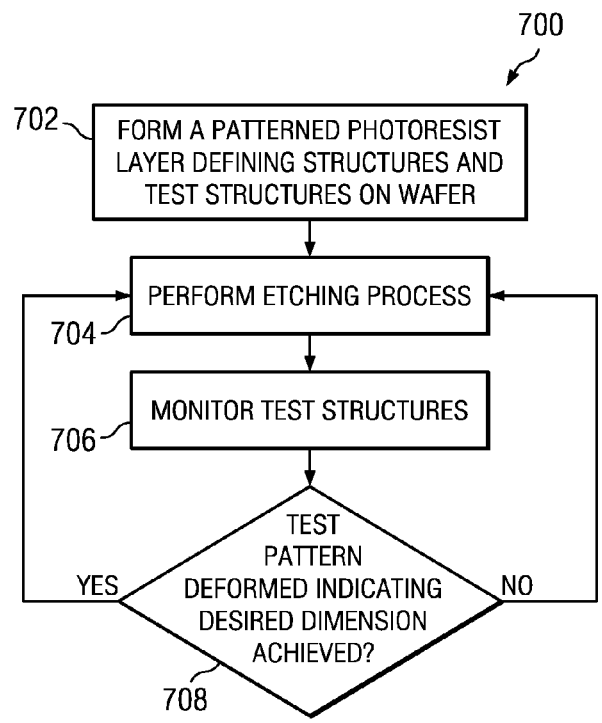
FIG. 7 is a flow chart showing a process utilizing a test structure according to various aspects of the present disclosure.

FIG. 7 is a flowchart showing a method 700 utilizing one embodiment of the claimed invention. Formation step 702 involves forming a patterned photoresist layer defining one or more functional structures and one or more test structures, which can be similar to functional structures on a wafer or substrate using a process such as photolithography. Etching step 704 involves using an etching technique to etch the functional structure and test structure into the surface films or bulk films or wafer or substrate. The functional structure includes a micro-electro-mechanical structure or other functional structure. The test structure includes a pattern as a indicator and a releasing mechanism connected with the pattern. In one embodiment, the etching technique comprises reactive ion etching (RIE). Monitoring step 706 involves utilizing an optical monitor to monitor the test structures etched in step 704 to determine which test structure patterns, if any, are out-of-plane. In the depicted embodiment, if the pattern of the test structure is deformed (e.g. out-of-plane, out-of-focus, in-plane etc.), it indicates that the etching step is complete and the functional structure is formed. Otherwise, the process returns to step 704 to resume the etching process until the monitoring step 706 confirms the etching step is complete.

In another embodiment, monitoring step 706 occurs in parallel with the etching process 704 such that the progress of the etching is monitored. In such an embodiment, once the monitoring step detects that the test structure is out-of-plane, the etching step 704 is terminated.

In certain embodiments of the invention, the test structure, including the pattern, may comprise multiple layers of material. The layers may be composed of a semiconductor material such as germanium, silicon, silicon carbide, gallium arsenic, gallium phosphide, indium phosphide, indium arsenide, or indium antimonide. Using multiple layers influences the sensitivity of the test pattern by changing the behavior of the test pattern after etching. For example, additional material may be added to the release mechanisms decrease the spring constant of the release mechanisms and thus enhance the degree to which the pattern goes out-of-plane when material is removed from the cavity. In certain embodiments, material may also be added to the pattern to increase its weight and thus increase the degree to which the structure goes out-of-plane. In some embodiments, the material added may be a metal, silicon oxide, or germanium. In certain embodiments, one of the layers of material may be a stress film that increases the amount of flex in the release mechanisms. Embodiments with both single and multiple layers of materials are contemplated by the present disclosure, which should not be seen as limiting the composition, number, or orientation of the layers in any way.

In certain embodiments of the invention, attributes of the pattern of test structure are varied to affect the dimension indicated by the test structure. These attributes include but are not limited to the weight of the pattern, the spring constant of the support release mechanisms, the size of the cavity, the material composition of the release mechanisms, the number of release mechanisms, and the pitch of any comb structures.

What is claimed is:

1. A method for process control comprising:
 performing an etching process on a semiconductor substrate thereby forming a structure and a moveable test structure, the moveable test structure having a pattern and a releasing mechanism coupled to the pattern, wherein performing the etching process causes the pattern to independently move with respect to a surface of the semiconductor substrate;
 monitoring the pattern of the moveable test, wherein monitoring the pattern of the moveable test structure includes detecting a movement of the pattern relative to the surface of the semiconductor substrate; and
 determining whether the etching process is complete with respect to the structure based on the detected movement of the pattern relative to the surface of the semiconductor substrate.

2. The method of claim 1, wherein the monitoring step is performed in parallel with the etching process.

3. The method of claim 1, wherein the monitoring step is performed after the etching process.

4. The method of claim 1, wherein the etching process is complete when a dimension of the structure has been achieved.

5. The method of claim 4, wherein the monitoring step includes determining if the pattern is out of plane using an optical signal.

6. A method comprising:
 performing an etching process on a semiconductor substrate, thereby forming a structure and a moveable test structure, each having a pattern, the moveable test structure having a releasing mechanism coupled to the pattern associated with the moveable test structure;
 monitoring the pattern of the moveable test structure to detect movement of the pattern of the moveable test structure relative to a surface of the semiconductor substrate; and
 determining whether the etching process is complete with respect to the structure based on detected movement of the pattern of the moveable test structure relative to the surface of the semiconductor substrate.

7. The method of claim 6, wherein the monitoring step is performed in parallel with the etching process.

8. The method of claim 6, wherein the monitoring step is performed after the etching process.

9. The method of claim 6, wherein monitoring the pattern of the moveable test structure to detect movement of the pattern of the moveable test structure relative to the surface of the semiconductor substrate includes monitoring the pattern of the moveable test structure for movement with respect to a plane of the semiconductor substrate.

10. The method of claim 9, wherein performing the etching process causes the pattern of the moveable test structure to move such that a top surface of the pattern is below the plane of the substrate.

11. The method of claim 9, wherein performing the etching process causes the pattern of the moveable test structure to move such that a top surface of the pattern is above the plane of the substrate.

12. The method of claim 6, wherein the structure is formed in a cell area of the semiconductor substrate and the moveable test structure is formed in a scribe line of the semiconductor substrate.

* * * * *